United States Patent
Cheng et al.

(10) Patent No.: US 11,081,482 B2
(45) Date of Patent: Aug. 3, 2021

(54) FABRICATION OF VERTICAL FIN FIELD EFFECT TRANSISTORS HAVING TOP AIR SPACERS AND A SELF ALIGNED TOP JUNCTION

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/684,227

(22) Filed: Nov. 14, 2019

(65) Prior Publication Data

US 2020/0083217 A1   Mar. 12, 2020

Related U.S. Application Data

(62) Division of application No. 15/336,309, filed on Oct. 27, 2016, now Pat. No. 10,535,652.

(51) Int. Cl.
*H01L 27/088* (2006.01)
*H01L 29/66* (2006.01)
(Continued)

(52) U.S. Cl.
CPC .......... *H01L 27/088* (2013.01); *H01L 21/764* (2013.01); *H01L 21/76224* (2013.01);
(Continued)

(58) Field of Classification Search
CPC .......... H01L 29/0653; H01L 29/41741; H01L 29/66666
See application file for complete search history.

(56) References Cited

U.S. PATENT DOCUMENTS 5,869,379 A   2/1999   Gardner et al.
5,915,182 A   6/1999   Wu
(Continued)

FOREIGN PATENT DOCUMENTS

KR   1020150007637 A   1/2015
KR   1020150053020 A   5/2015

OTHER PUBLICATIONS

Je Min Park, "Improving CMOS Speed and Switching Power with Air-gap Structures," Electrical Engineering and Computer Sciences University of California at Berkeley. Technical Report No. UCB/EECS-2011-84. Jul. 21, 2011. http://www.eecs.berkeley.edu/Pubs/TechRpts/2011/EECS-2011-84.html. pp. 1-119.
(Continued)

*Primary Examiner* — Cuong Q Nguyen
*Assistant Examiner* — Peter M Albrecht
(74) *Attorney, Agent, or Firm* — Tutunjian & Bitetto, P.C.; Kurt Goudy

(57) ABSTRACT

A method of fabricating adjacent vertical fins with top source/drains having an air spacer and a self-aligned top junction, including, forming two or more vertical fins on a bottom source/drain, forming a top source/drain on each of the two or more vertical fins, wherein the top source/drains are formed to a size that leaves a gap between the adjacent vertical fins, and forming a source/drain liner on the top source/drains, where the source/drain liner occludes the gap between adjacent top source/drains to form a void space between adjacent vertical fins.

20 Claims, 10 Drawing Sheets

(51) Int. Cl.
  *H01L 29/08* (2006.01)
  *H01L 21/8234* (2006.01)
  *H01L 21/764* (2006.01)
  *H01L 29/78* (2006.01)
  *H01L 21/762* (2006.01)
  *H01L 21/8238* (2006.01)
  *H01L 27/092* (2006.01)

(52) U.S. Cl.
  CPC ........ *H01L 21/823418* (2013.01); *H01L 21/823475* (2013.01); *H01L 21/823487* (2013.01); *H01L 29/0847* (2013.01); *H01L 29/66666* (2013.01); *H01L 29/7827* (2013.01); *H01L 21/823814* (2013.01); *H01L 21/823885* (2013.01); *H01L 27/092* (2013.01)

(56) References Cited

U.S. PATENT DOCUMENTS

| | | | |
|---|---|---|---|
| 6,127,712 A | 10/2000 | Wu | |
| 7,972,968 B2 | 7/2011 | Lee et al. | |
| 8,637,384 B2 | 1/2014 | Ando et al. | |
| 8,637,930 B2 | 1/2014 | Ando et al. | |
| 9,035,365 B2 | 5/2015 | Adam et al. | |
| 9,312,383 B1* | 4/2016 | Cheng | H01L 21/84 |
| 10,026,662 B2* | 7/2018 | Sung | H01L 22/30 |
| 2013/0093019 A1 | 4/2013 | Ando et al. | |
| 2013/0095629 A1 | 4/2013 | Ando et al. | |
| 2014/0217517 A1* | 8/2014 | Cai | H01L 29/41791 257/401 |
| 2015/0263021 A1 | 9/2015 | Hwang et al. | |
| 2016/0093611 A1* | 3/2016 | Cheng | H01L 21/823475 257/329 |

OTHER PUBLICATIONS

List of IBM Patents or Patent Applications Treated as Related dated Nov. 14, 2019, 2 pages.

* cited by examiner

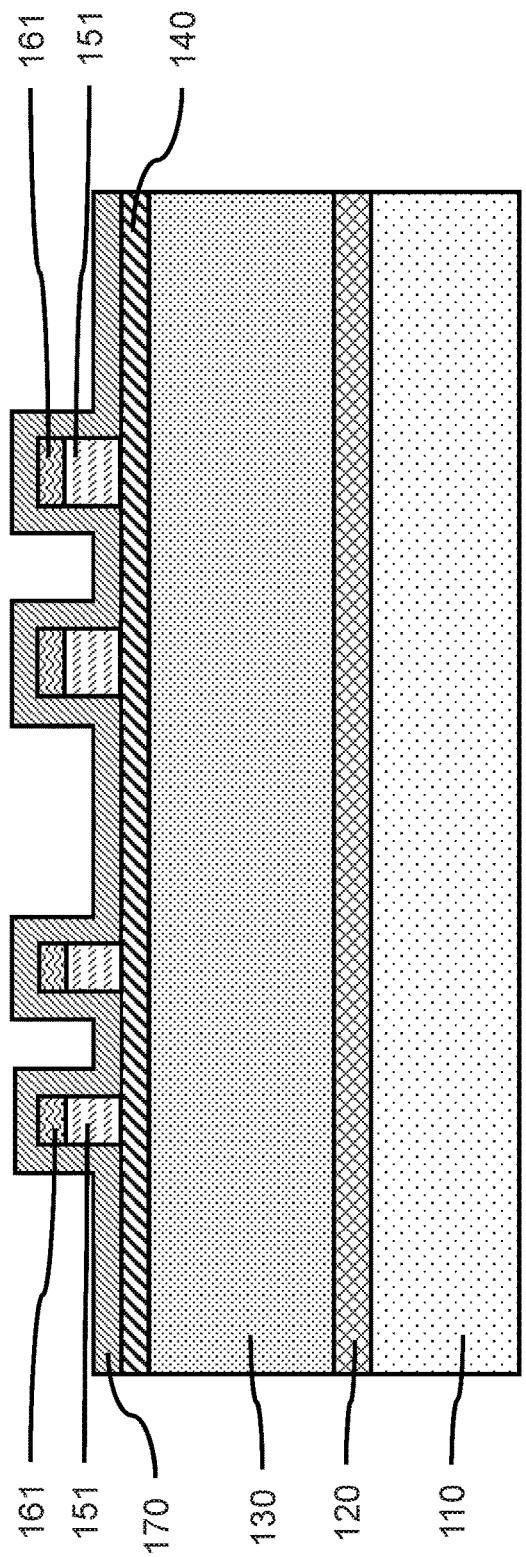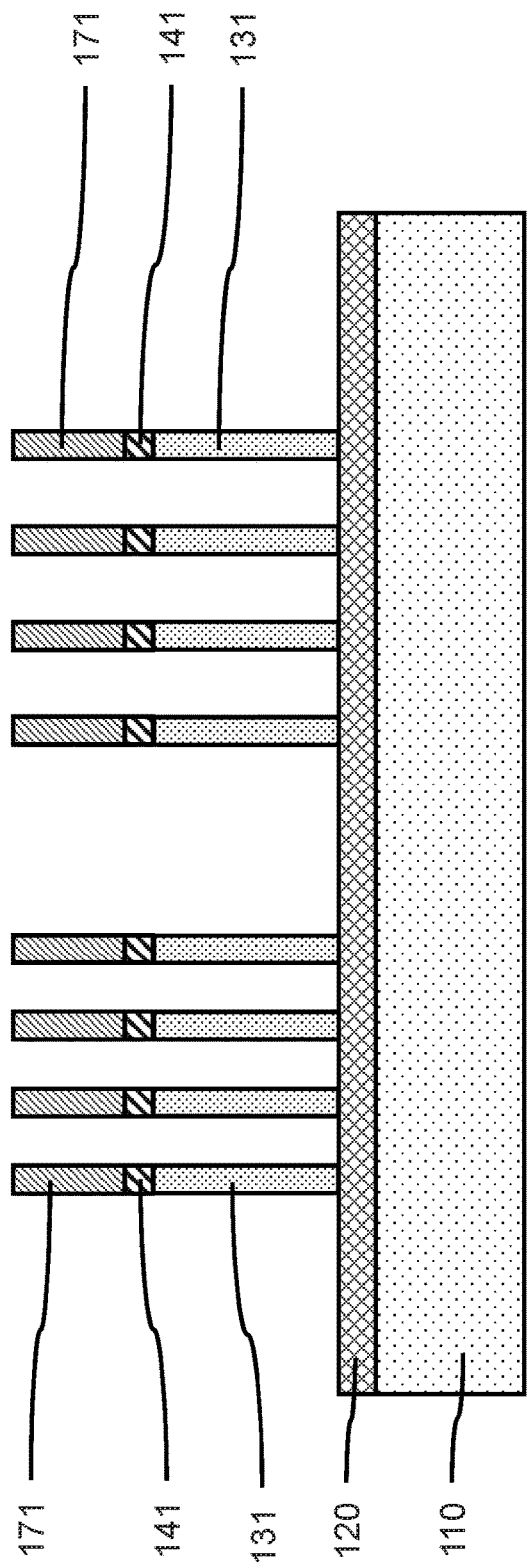

FABRICATION OF VERTICAL FIN FIELD EFFECT TRANSISTORS HAVING TOP AIR SPACERS AND A SELF ALIGNED TOP JUNCTION

BACKGROUND

Technical Field

The present invention generally relates to adjacent vertical fin field effect transistors (FinFETs) having top air spacers and a self-aligned top junction, and more particularly to forming a fused liner on unmerged top source/drains to form a void space.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate in the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS), where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a method of fabricating adjacent vertical fins with top source/drains having an air spacer and a self-aligned top junction is provided. The method includes forming two or more vertical fins on a bottom source/drain. The method further includes forming a top source/drain on each of the two or more vertical fins, wherein the top source/drains are formed to a size that leaves a gap between the adjacent vertical fins. The method further includes forming a source/drain liner on the top source/drains, where the source/drain liner occludes the gap between adjacent top source/drains to form a void space between adjacent vertical fins.

In accordance with another embodiment of the present invention, a method of fabricating a plurality of vertical fin field effect transistors with top air spacers and a self-aligned top junction is provided. The method includes forming a bottom source/drain layer at the surface of a substrate. The method further includes forming a plurality of vertical fins on the source/drain layer. The method further includes forming a bottom spacer layer on the bottom source/drain layer. The method further includes forming a gate structure on each of the plurality of vertical fins. The method further includes forming atop spacer layer on the gate structures, and forming a first set of top source/drains on fewer than all the plurality of vertical fins, wherein there is a gap between adjacent top source/drains in the first set. The method further includes forming a second set of top source/drains on fewer than all the plurality of vertical fins, wherein there is a gap between adjacent top source/drains in the second set. The method further includes forming a source/drain liner on the top source/drains in the first set and the top source/drains in the second set.

In accordance with another embodiment of the present invention, a plurality of vertical fin devices with top air spacers and a self-aligned top junction is provided. The plurality of vertical fin devices includes a first bottom source/drain and a second bottom source/drain on a substrate, wherein the first bottom source/drain is separated from the second bottom source/drain by an isolation region in the substrate filled with an isolation region material. The plurality of vertical fin devices further includes at least two vertical fins on the first bottom source/drain, at least two vertical fins on the second bottom source/drain. The plurality of vertical fin devices further includes a gate structure on each of the at least four vertical fins. The plurality of vertical fin devices further includes a top source/drain on the at least two vertical fins on the first bottom source/drain, wherein the top source/drains are separated by a gap. The plurality of vertical fin devices further includes a top source/drain on the at least two vertical fins on the second bottom source/drain, wherein the top source/drains are separated by a gap having about the same size as the gap between the top source/drains on the at least two vertical fins on the first bottom source/drain. The plurality of vertical fin devices further includes a source/drain liner on the at least four top source/drains, wherein the source/drain liner forms liner plugs that occlude the gaps between the top source/drains to form a void space between the at least two vertical fins on the first bottom source/drain, and between the at least two vertical fins on the second bottom source/drain.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 3 is a cross-sectional side view showing a spacer layer formed on the mandrel templates, sacrificial mandrels, and exposed surface of the fin template layer, in accordance with an embodiment of the present invention;

FIG. 4 is a cross-sectional side view showing a plurality of vertical fins with a fin template and spacer on each of the vertical fins, in accordance with an embodiment of the present invention;

DETAILED DESCRIPTION

Figure 1:
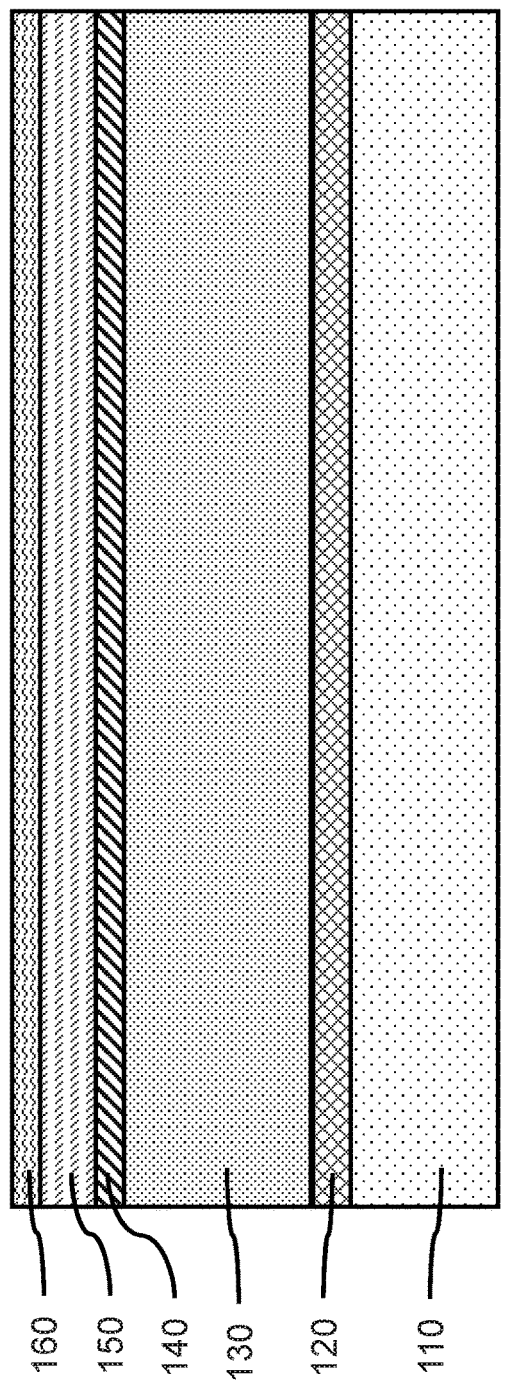
FIG. 1 is a cross-sectional side view showing a substrate with a bottom source/drain layer on the substrate, a vertical fin layer on the bottom source/drain layer, fin template layer on the vertical fin layer, a sacrificial mandrel layer on the fin template layer, and a mandrel template layer on the sacrificial mandrel layer, in accordance with an embodiment of the present invention.

Principles and embodiments of the present invention relate generally to forming top air spacers between top source/drains and a gate structure on a vertical FinFET device. Formation of air spacers between the top source/drain and gate structure can provide a reduced parasitic capacitance, which can have improved delay and reduced power dissipation.

Principles and embodiments of the present invention also relate to use of a liner layer on adjacent top source/drains to pinch off a region below the top source/drains to prevent a filler material with a dielectric constant greater than air from filling the space between the top source/drain and gate structure. Control of different distances between a plurality of vertical fins (e.g., fin pitch) and/or controlled formation of top source/drains can adjust the spacing between top source/drains to facilitate a liner layer fusing into a continuous cover at a predetermined thickness.

Principles and embodiments of the present invention also relate to a self-aligned top junction, where the top junctions can be formed by plasma doping of an upper portion of the vertical fins from the sidewalls of the extension regions. A top spacer may be used to provide an extension region with a predetermined length based on the top spacer thickness.

Exemplary applications/uses to which the present invention can be applied include, but are not limited to: vertical FinFETs, complementary metal-oxide-semiconductor (CMOS) field effect transistors, digital logic gates (e.g., NAND, NOR, XOR, etc.) and memory devices (e.g., DRAM, SRAM, etc.).

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

Reference to source/drain projections, layers, regions, etc., is intended to indicate that the particular device feature can be implemented as a source or a drain except as expressly indicated otherwise. In addition, the role of source and drain for an active device can in some instances be reversed, so a previously indicated drain may instead be a source and vice versa. Reference to a source/drain is, therefore, intended to encompass the broadest reasonable scope of the term.

It is to be understood that aspects of the present invention will be described in terms of a given illustrative architecture; however, other architectures, structures, substrate materials and process features and steps can be varied within the scope of aspects of the present invention.

It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a cross-sectional side view showing a substrate with a bottom source/drain layer on the substrate, a vertical fin layer on the bottom source/drain layer, fin template layer on the vertical fin layer, a sacrificial mandrel layer on the fin template layer, and a mandrel template layer on the sacrificial mandrel layer is shown, in accordance with an embodiment of the present invention.

In one or more embodiments, a substrate 110 can be a semiconductor or an insulator, or a combination of semiconductor and insulator with an active surface layer (ASL) made of a semiconductor material at the substrate surface. Various portions of the substrate 110 can be crystalline, semi-crystalline, microcrystalline, or amorphous. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe. In various embodiments, the substrate can include a carrier portion that can be polycrystalline or amorphous, or an insulating material (e.g. glass, $Al_2O_3$, SiC, etc.) and an active surface layer that is a single crystal semiconductor material.

In one or more embodiments, the substrate 110 can have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI), where an active surface semiconductor layer of the substrate 110 can be on a substrate insulator layer (e.g., buried oxide layer (BOX)). The substrate 110 can also have other layers forming the substrate, including high-k oxides and/or nitrides. The substrate 110 can also have other device structures such as isolation regions (not shown). In one or more embodiments, a substrate insulator layer (e.g., BOX layer) can be formed on at least a portion of a substrate 110.

In various embodiments, the substrate 110 may be a single crystal silicon (Si), silicon-germanium (SiGe), or III-V semiconductor (e.g., GaAs) wafer, or have a single crystal silicon (Si), silicon-germanium (SiGe), or III-V semiconductor (e.g., GaAs) active surface layer. In one or more embodiments, the substrate 110 can be a single crystal silicon wafer.

In various embodiments, the substrate can be n-doped (e.g., with phosphorous, arsenic, antimony, etc.) or p-doped (e.g., with boron, gallium, indium, etc.), where the substrate dopant can be a counter-dopant for a bottom source/drain dopant type.

In one or more embodiments, a bottom source/drain layer 120 can be formed at the surface of the substrate 110, where the bottom source drain layer 120 may be formed from the substrate surface material (e.g., through dopant implantation) or formed on the substrate surface (e.g., by epitaxial growth and in situ or ex situ dopant implantation).

In various embodiments, the bottom source/drain layer 120 can be formed by epitaxial growth on an exposed portion of the substrate 110, and/or dopants can be implanted into the bottom source/drain layer 120. The bottom source/drain layer 120 can be in-situ doped (where doping and epitaxy growth are performed at the same time), and/or ex-situ doped (where doping occurs before and/or after epitaxy). Dopants can be incorporated during epitaxy or by other suitable doping techniques, including but not limited to, ion implantation, gas phase doping, plasma doping, plasma immersion ion implantation, cluster doping, infusion doping, liquid phase doping, solid phase doping, etc. In various embodiments, the bottom source/drain layer 120 can be doped to form n-type or p-type source/drains to fabricate NFETs or PFETs.

In one or more embodiments, a vertical fin layer 130 can be formed on the bottom source/drain layer 120, where a crystalline vertical fin layer can be epitaxially grown on a crystalline bottom source/drain layer 120 having a predetermined crystal orientation.

In one or more embodiments, the vertical fin layer 130 can be silicon or silicon-germanium, where the vertical fin layer can be strained or unstrained depending on the amount of lattice mismatch between the material of the vertical fin layer 130 and the material of the bottom source/drain layer 120 and/or substrate 110.

In one or more embodiments, a fin template layer 140 can be formed on the vertical fin layer 130, where the fin template layer 140 can be patterned to form masks for forming one or more vertical fins.

In one or more embodiments, the fin template layer 140 can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof.

In one or more embodiments, a sacrificial mandrel layer 150 may be formed on at least a portion of the hardmask layer 140. The sacrificial mandrel layer 150 may be a semiconductor material, for example, amorphous silicon (a-Si), polycrystalline silicon (p-Si), microcrystalline silicon (m-Si), amorphous carbon (a-C), or combinations thereof.

In one or more embodiments, a mandrel template layer 160 can be formed on the sacrificial mandrel layer 150, where the mandrel template layer 160 can be a lithography resist material, for example, an photoresist material or an e-beam resist material (e.g., poly methylmethacrylate (PMMA), hydrogen silsesquioxane (HSQ), etc.). In various embodiments, the mandrel template layer 160 can be spun onto the surface of the sacrificial mandrel layer 150.

Figure 2:
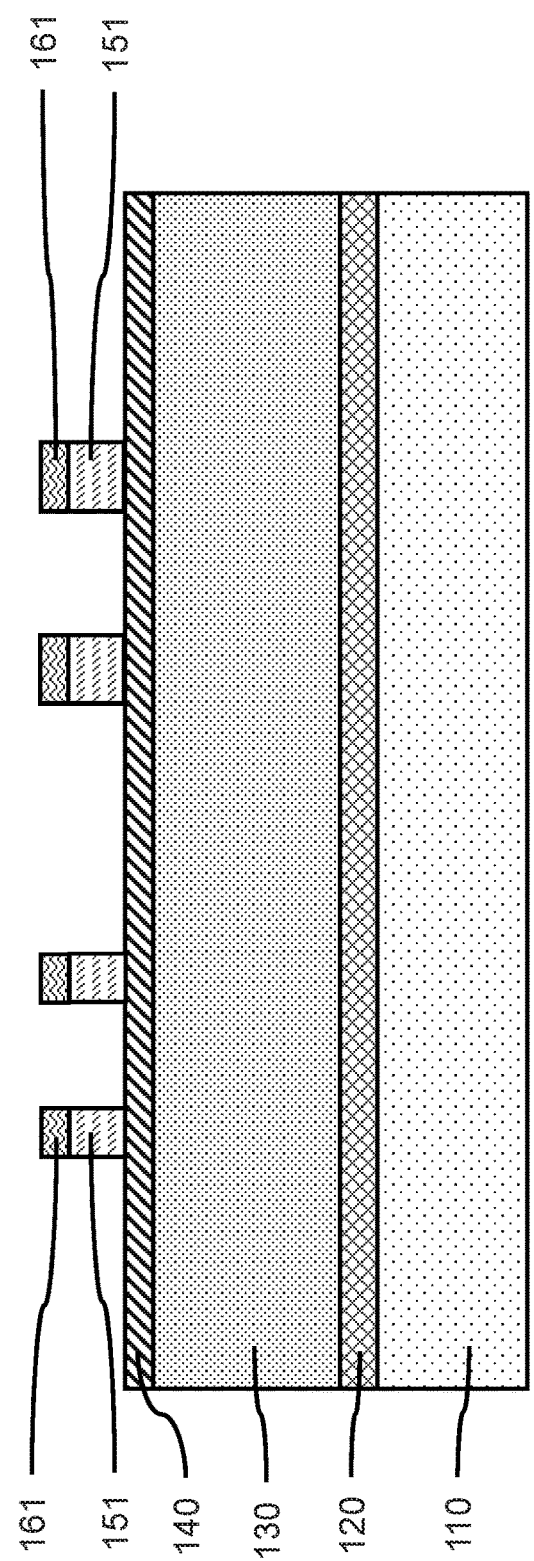
FIG. 2 is a cross-sectional side view showing a bottom source/drain layer at the surface of the substrate, a vertical fin layer on the bottom source/drain layer, a fin template layer on the vertical fin layer, and a plurality of mandrel templates and sacrificial mandrels on the fin template layer, in accordance with an embodiment of the present invention.

FIG. 2 is a cross-sectional side view showing a bottom source/drain layer at the surface of the substrate, a vertical fin layer on the bottom source/drain layer, a fin template layer on the vertical fin layer, and a plurality of mandrel templates and sacrificial mandrels on the fin template layer, in accordance with an embodiment of the present invention.

In one or more embodiments, the mandrel template layer 160 can be patterned and developed to form one or more mandrel templates 161 on the sacrificial mandrel layer 150, where portions of the underlying sacrificial mandrel layer 150 are exposed between the mandrel templates 161. Exposed portions of the sacrificial mandrel layer 150 can be removed to form a plurality of sacrificial mandrels 151 on the fin template layer 140. In various embodiments, the mandrel template layer 160 can be patterned and developed to form one or more mandrel templates 161 that cover a portion of the sacrificial mandrel layer 150, while exposing other portions of the sacrificial mandrel layer 150.

In one or more embodiments, a plurality of sacrificial mandrels 151 can be formed from the sacrificial mandrel layer 150, where a directional, anisotropic etch may be used to form the sacrificial mandrels. An anisotropic etch may be a dry plasma etch, for example, a reactive ion etch (RIE), that preferentially removes material from the sacrificial mandrel layer 150 in a direction normal to the surface, while limiting etching of the sidewalls. The plurality of sacrificial mandrels may act as templates for forming spacers for a sidewall image transfer (SIT) process.

The sacrificial mandrels can be located on the fin template layer 140 to provide for formation of vertical fins having a predetermined pitch (i.e., distance between the same face of two adjacent vertical fins) and/or spacing (i.e., distance between facing sides of adjacent vertical fins), where the width of the sacrificial mandrels can determine the spacing between spacers and thereby adjacent vertical fins.

In one or more embodiments, the sacrificial mandrels 151 can have a width in the range of about 5 nm to about 60 nm, or in the range of about 10 nm to about 40 nm, where the width of a sacrificial mandrel can define the distance between two spacers, and thereby, two subsequently formed adjacent vertical fins 131.

FIG. 3 is a cross-sectional side view showing a spacer layer formed on the mandrel templates, sacrificial mandrels, and exposed surface of the fin template layer, in accordance with an embodiment of the present invention.

In one or more embodiments, one or more spacer layer(s) 170 may be formed on one or more of the sacrificial mandrels 151 and mandrel templates 161. The spacer layer 170 can be formed by a blanket deposition over the sacrificial mandrels 151 and exposed portions of the surface of the fin template layer 140. In various embodiments, the thickness of the spacer layer 170 can define a width of a vertical portion of the spacer layer 170 on the sidewalls of the sacrificial mandrel 151, which can thereby determine the width of a vertical fin, and adjust the pitch between vertical fins. A conformal deposition process (e.g., ALD, PEALD) can be used to form the spacer layer 170 and control the spacer layer thickness. The thickness of the spacer layer 170 can be predetermined to control the width, W, of the subsequently formed vertical fins 131, and to vary the pitch between fin templates by introducing additional spacer layers to provide variably spaced vertical fins. Using an SIT process or double SIT process provides chemical process control over critical dimension (CD) resolution (e.g., monolayer thickness resolution for ALD) in place of optical resolution limits on critical dimensions.

In one or more embodiments, the spacer layer may have a thickness in the range of about 3 nm to about 25 nm, or in the range of about 5 nm to about 20 nm.

In one or more embodiments, the spacer layer 170 can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof.

FIG. 4 is a cross-sectional side view showing a plurality of vertical fins with a fin template and spacer on each of the vertical fins, in accordance with an embodiment of the present invention.

In one or more embodiments, a portion of the spacer layer 170 can be removed to form spacers 171 on the sidewalls of the sacrificial mandrels 151 and mandrel templates 161, where the spacer layer 170 can be removed using a directional etch (e.g., RIE). The spacers 171 can mask a portion of the fin template layer 140. A directional etch can be used to remove exposed portions of the fin template layer 140 to form fin templates 141 on the vertical fin layer 130.

In various embodiments, the mandrel templates 161 and sacrificial mandrels 151 can be selectively removed to leave the spacers 171 on the fin template layer 140 before forming the vertical fins 131. The sacrificial mandrels 151 can be removed by a selective isotropic etch that removes the material of the sacrificial mandrels without notably affecting effecting the spacers or fin template layer 140.

In one or more embodiments, the sacrificial mandrels 161 can be removed to form a plurality of free-standing spacers 171, where the spacers may have a first pitch controlled by the spacer width and width of the sacrificial mandrels, and a second pitch controlled by the pitch of the sacrificial mandrels, such that the free standing spacers can be shifted closer to or further from a neighboring spacer.

In various embodiments, the pattern of the spacers 171 can be transferred to the fin template layer 140, by a directional etch to form fin templates 141.

In various embodiments, exposed portions of the vertical fin layer 130 can be removed to form one or more vertical fins 131, where the vertical fin layer material can be removed by a directional etch. The portions of the vertical fin layer 130 between the fin templates 141 can be removed by a directional etch, for example, a reactive ion etch or a neutral beam etch (NBE).

In one or more embodiments, a vertical fin 131 can be formed on a substrate 110. In various embodiments, the vertical fins 131 can be etched into the vertical fin layer 130 on the bottom source/drain layer 120 by employing a lithographic patterning process, a sidewall image transfer (SIT) process, or epitaxially grown on the substrate. The vertical fin 131 can be formed by a SIT process (i.e., self-aligned double patterning (SADP)), or double sidewall image transfer process (e.g., self-aligned quadruple patterning (SAQP)), as would be known in the art.

In one or more embodiments, the one or more vertical fin(s) 131 can have a predetermined height, width, and length.

In one or more embodiments, the vertical fins 131 can have a pitch in the range of about 20 nm to about 200 nm, or in the range of about 70 nm to about 120 nm, or in the range of about 24 nm to about 80 nm, or in the range of about 35 nm to about 100 nm, where the pitch between vertical fins 131 can control the distance to be spanned by a top source/drains formed on a plurality of vertical fins 131.

In various embodiments, each of the one or more vertical fin(s) 131 can be formed on a portion of the underlying bottom source/drain layer 120, where the bottom source/drain layer may form a source/drain for one or more of the vertical fin(s) 131.

In one or more embodiments, the vertical fin 131 can be a strained vertical fin made of a semiconductor material. The vertical fin 131 can have a tensile or compressive strain. In some embodiments, the strain in the vertical fin 131 ranges from 0.3% to 1.5%, although fins with greater or less strain can also be employed.

In one or more embodiments, the distance between two adjacent vertical fins 131 can be in the range of about 10 nm to about 200 nm, or in the range of about 15 nm to about 50 nm, or in the range of about 15 nm to about 30 nm, although other distances are also contemplated.

In one or more embodiments, the distance between two adjacent vertical fins 131 can be in the range of about 20 nm to about 80 nm, or in the range of about 30 nm to about 80 nm, or in the range of about 50 nm to about 80 nm, although other distances are also contemplated.

Figure 5:
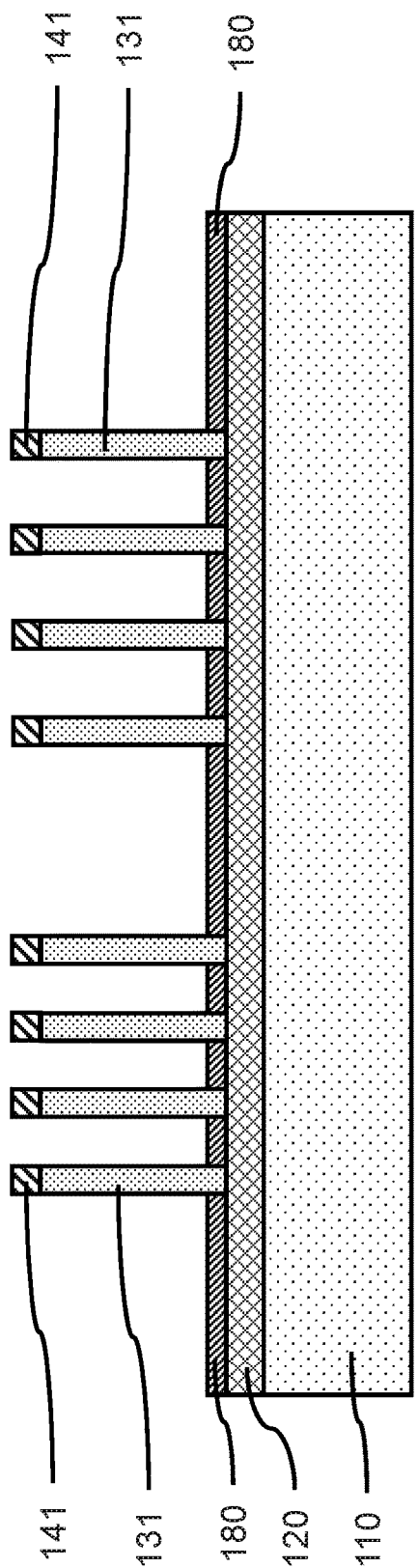
FIG. 5 is a cross-sectional side view showing a bottom spacer formed on the plurality of vertical fins and bottom source/drain layer, in accordance with an embodiment of the present invention.

FIG. 5 is a cross-sectional side view showing a bottom spacer formed on the plurality of vertical fins and bottom source/drain layer, in accordance with an embodiment of the present invention.

In one or more embodiments, a bottom spacer layer 180 can be formed on the bottom source/drain layer 120, for example, by a directional deposition (e.g., gas cluster ion beam (GCIB)), or a high density plasma (HDP) deposition. The high density plasma can provide an anisotropic deposition (i.e., having some directionality) that results in a thicker bottom spacer layer 180 formed on surfaces approximately perpendicular to the incident plasma species and a reduced thickness on surfaces approximately parallel with the incident plasma species (e.g., vertical surfaces). A conformal (e.g., isotropic wet etch) etch can remove the lesser thickness of deposited material from the sidewalls, without removing all of the thicker bottom spacer layer 180 material on the approximately perpendicular surfaces (e.g., horizontal surfaces).

In one or more embodiments, the bottom spacer layer 180 can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof.

In various embodiments, bottom spacer layer 180 material that becomes deposited on the sidewalls of the vertical fins 131 can be etched back, for example, using an isotropic etch.

In one or more embodiments, the bottom spacer layer 180 can have a thickness in the range of about 3 nm to about 25 nm, or in the range of about 5 nm to about 20 nm, or about 7 nm to about 15 nm, although other thicknesses are contemplated.

Figure 6:
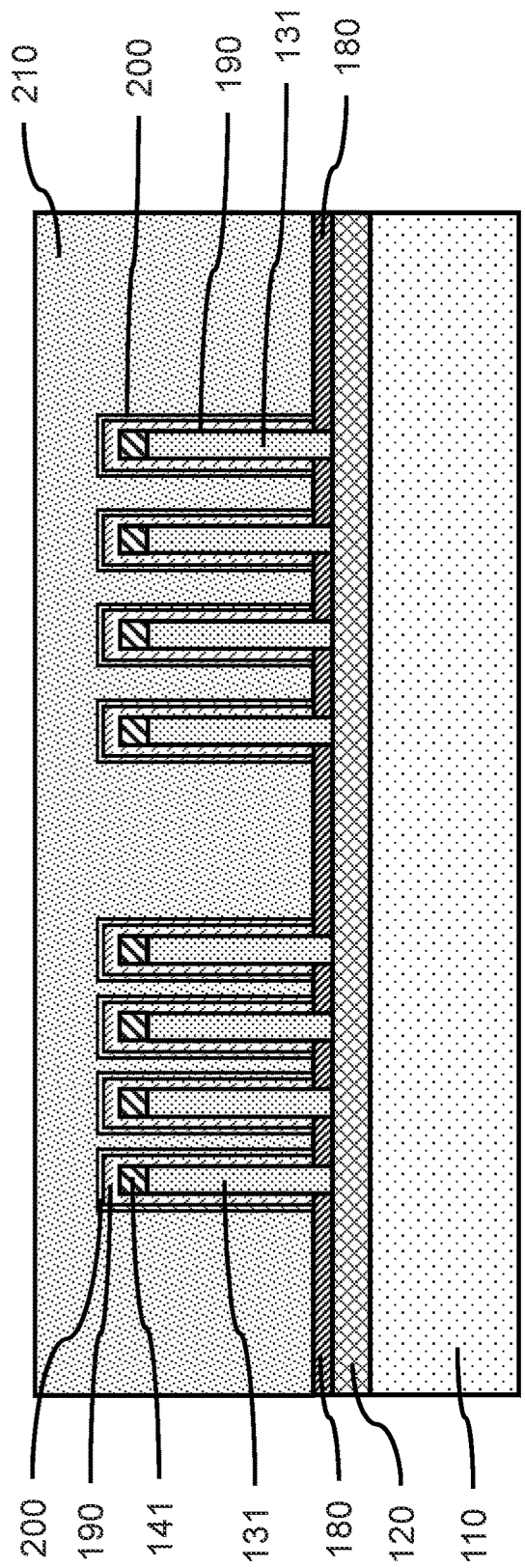
FIG. 6 is a cross-sectional side view showing a gate structure formed on each of the vertical fins, in accordance with an embodiment of the present invention.

FIG. 6 is a cross-sectional side view showing a gate structure formed on each of the vertical fins, in accordance with an embodiment of the present invention.

In one or more embodiments, a gate structure can be formed on the bottom spacer layer 180, where the gate structure can include a gate dielectric layer 190 formed on at least a portion of the exposed surfaces of the vertical fin 131 and a conductive gate electrode including a conductive gate fill layer 210 and optionally a work function layer 200 between the gate dielectric layer 190 and the conductive gate fill layer 210. In various embodiments, the gate structure can be formed by self-aligned double patterning (SADP) or self-aligned quadruple patterning (SAQP) techniques.

In various embodiments, the gate structure may be formed by a 'gate first' process, in which layers for the gate dielectric layer 190, work function layer 200, and conductive gate fill layer 210 can be formed on one or more vertical fin(s) 131. A lithography mask (e.g., a photoresist layer and/or hardmask) can be formed on the conductive gate fill layer 210 over the one or more vertical fin(s) 131, and patterned to expose portions of the conductive gate fill layer 210, work function layer 200, and gate dielectric layer 190 for subsequent removal. An etching process (e.g., RIE) can be utilized to remove the conductive gate fill layer, work function layer, and gate dielectric layer to expose portions of the bottom spacer layer 180 and/or bottom source/drain 120.

In one or more embodiments, a gate structure can be formed by a 'gate-last' process. In a gate-last process, a dummy gate structure (not shown) is formed first, followed by the gate spacer, source/drain, and interlevel dielectric. The dummy gate is then removed and replaced by the actual gate structure. In various embodiments, the gate dielectric layer 190 can be formed on the exposed surfaces within the void space formed by a gate spacer after removal of the dummy gate, and on the exposed surfaces of the vertical fin 131 within the void space. A work function layer 200 can be formed on the gate dielectric layer 190. A conductive gate fill layer 210 can be formed in the remain void space after formation of the gate dielectric layer and work function layer.

In various embodiments, the gate dielectric layer 190 can include silicon oxide (SiO), silicon nitride (SiN), silicon oxynitride (SiON), boron nitride (BN), high-k dielectric materials, or a combination of these materials. Examples of high-k dielectric materials include, but are not limited to, metal oxides such as hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material can further include dopants such as lanthanum (La) and aluminum (Al).

In various embodiments, the conductive gate fill layer 210 material can include doped polycrystalline silicon (p-Si) or amorphous silicon (a-Si), germanium (Ge), silicon-germanium (SiGe), a metal (e.g., tungsten, titanium, tantalum, ruthenium, zirconium, cobalt, copper, aluminum, lead, platinum, tin, silver, or gold), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO), cobalt silicide (CoSi), or nickel silicide (NiSi)), carbon nanotube(s) (CNTs), conductive carbon, graphene, or any suitable combination of these materials. The conductive gate fill layer material can further include dopants that are incorporated during or after formation (e.g., deposition).

In various embodiments, the gate structure (e.g., gate stack) can further include a work function setting layer. The work function layer 200 can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

In one or more embodiments, the conductive gate fill layer 210 can be formed on the work function layer 200 by a blanket deposition, where the conductive gate fill layer 210 can extend above the top surfaces of the work function layer 200 and/or gate dielectric layer 190 on the top surfaces of the vertical fins 131. The conductive gate fill layer 210 can be etched back or a CMP can be used to reduce the height of the conductive gate fill layer 210.

Figure 7:
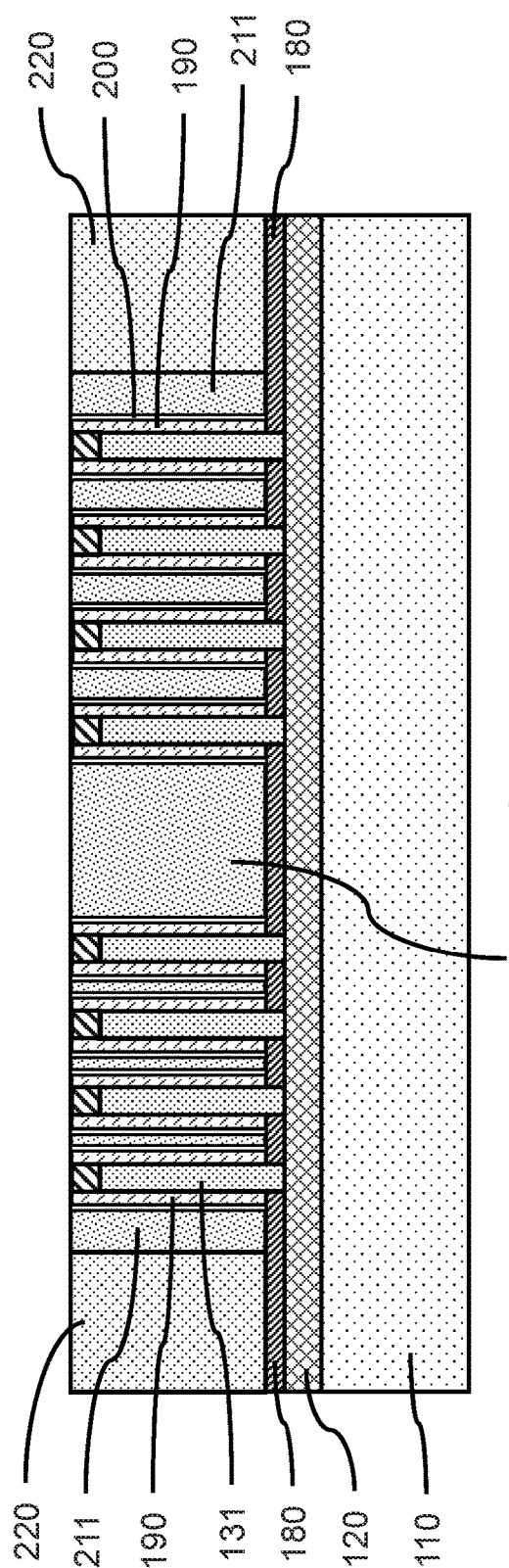
FIG. 7 is a cross-sectional side view showing a filler layer formed on portions of the bottom source/drain layer through openings formed in the conductive gate fill layer, work function layer, and gate dielectric layer, in accordance with an embodiment of the present invention.

FIG. 7 is a cross-sectional side view showing a filler layer formed on portions of the bottom source/drain layer through openings formed in the conductive gate fill layer, work function layer, and gate dielectric layer, in accordance with an embodiment of the present invention.

In one or more embodiments, the work function layer 200 and gate dielectric layer 190 can be removed from horizontal surfaces of the bottom spacer layer 180 and vertical fin templates 141, where the work function layer 200 and gate dielectric layer 190 can be removed by a directional etch (e.g., RIE). In various embodiments, the work function layer 200 and gate dielectric layer 190 can be removed from the bottom spacer layer 180 before formation of the conductive gate fill layer 210, where the conductive gate fill layer 210 can be blanket deposited on the exposed portions of the bottom spacer layer 180, gate dielectric layer 190 and/or work function layer 200 if present.

In one or more embodiments, portions of the conductive gate fill layer 210 and vertical fin templates 141 can be masked and patterned to expose predetermined portions of the conductive gate fill layer 210 for removal. Portions of the conductive gate fill layer 210 can be removed to provide regions for formation of a filler layer on the bottom spacer layer 180. Removal of portions of the conductive gate fill layer 210 can leave a conductive gate slab 211 on the gate dielectric layer 190 and/or work function layer 200.

In one or more embodiments, a filler layer 220 may be formed in openings in the conductive gate fill layer 210, where the filler layer 220 can be blanket deposited to fill in the openings. The openings and filler layer 220 can be positioned to the side of a region with one or more vertical fins 131, where a bottom source/drain contact could subsequently be formed to a portion of the bottom source/drain layer 120. The filler layer 220 can be directly on a surface of the conductive gate slab 211 forming a gate structure.

In one or more embodiments, the filler layer 220 can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof.

Figure 8:
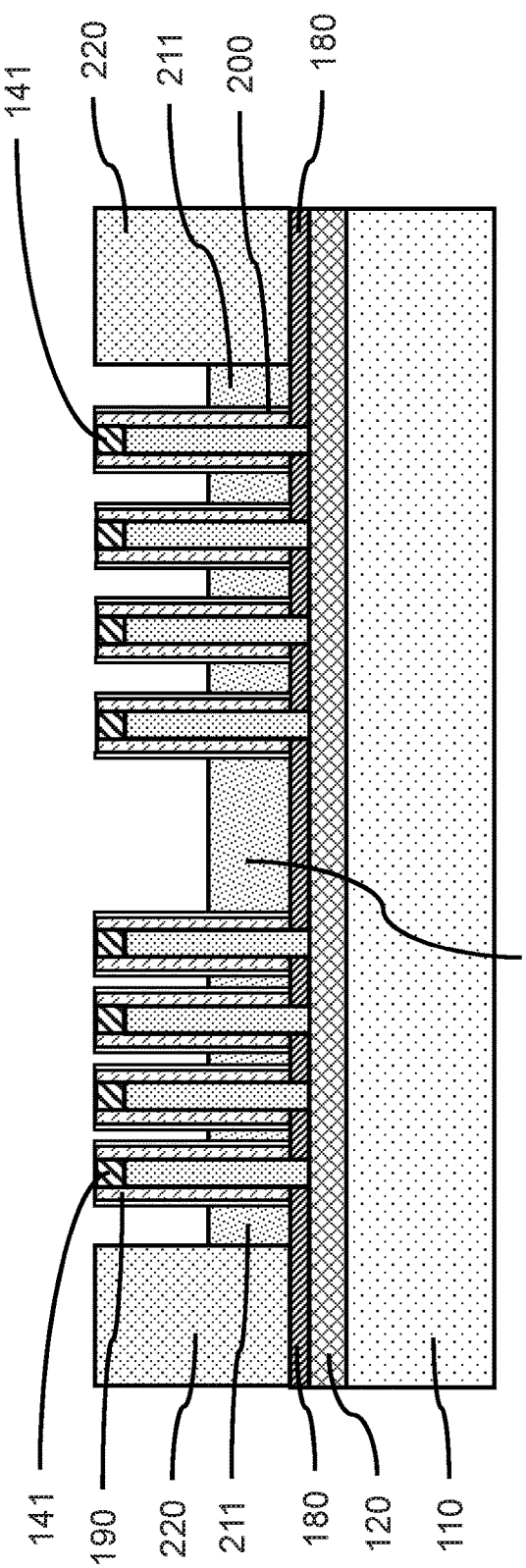
FIG. 8 is a cross-sectional side view showing the conductive gate fill layer having a reduced height, in accordance with an embodiment of the present invention.

FIG. 8 is a cross-sectional side view showing the conductive gate fill layer having a reduced height, in accordance with an embodiment of the present invention.

In one or more embodiments, a portion of the conductive gate fill layer 210 can be removed, for example, by RIE, to reduce the height of the conductive gate fill layer 210 on the gate dielectric layer 190 and/or work function layer 200.

In various embodiments, the top surface of the conductive gate fill layer 210 and conductive gate slab(s) 211 can be reduced to about a middle third section of the vertical fin height, such that sufficient height of the vertical fin 131 could be exposed for subsequent formation of a top spacer layer and top source/drains on the vertical fin 131. The reduced height of the conductive gate fill layer 210 can define a gate length on the vertical fin(s) 131.

Figure 9:
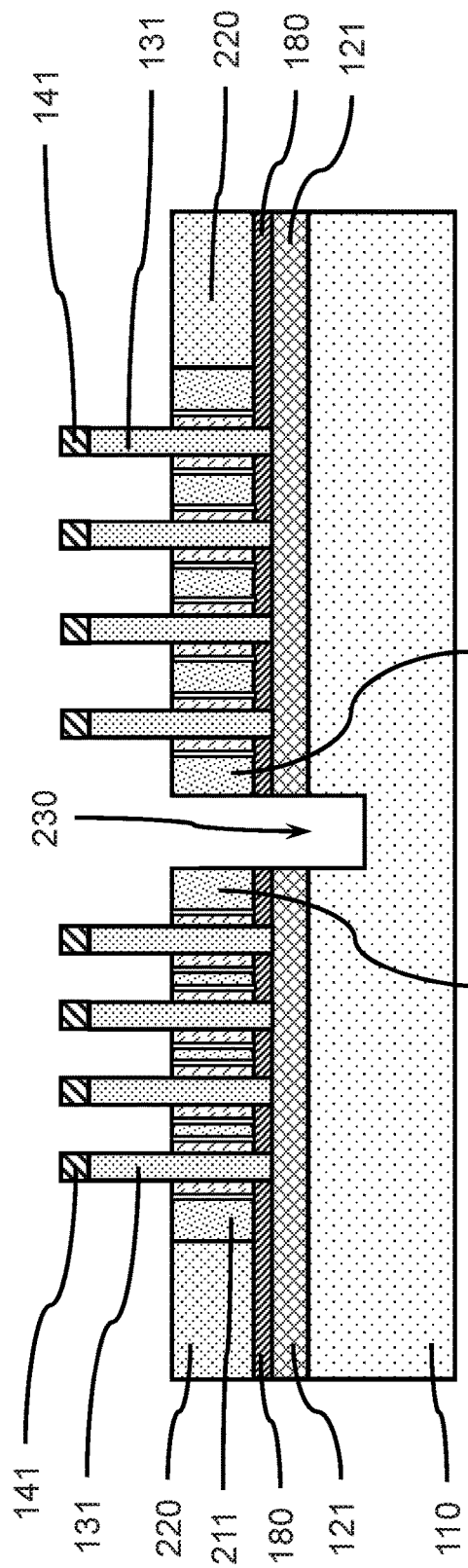
FIG. 9 is a cross-sectional side view showing an isolation region trench formed though the conductive gate fill layer, bottom spacer layer, bottom source/drain layer and into a portion of the substrate, in accordance with an embodiment of the present invention.

FIG. 9 is a cross-sectional side view showing an isolation region trench formed though the conductive gate fill layer, bottom spacer layer, bottom source/drain layer and into a portion of the substrate, in accordance with an embodiment of the present invention.

In one or more embodiments, the conductive gate fill layer 210 and vertical fin templates 141 can be masked using, for example, a resist material and/or hardmask, and a portion of the conductive gate fill layer 210 exposed through patterning the resist material and/or hardmask. One or more etching processes can be used to remove a portion of the conductive gate fill layer 210, bottom spacer layer 180, and bottom source/drain layer 120 to form an isolation region trench 230. The isolation region trench 230 can be between two regions of the substrate, where each region has one or more vertical fins 131 formed thereon. The isolation region trench 230 can physically and electrically separate a portion of the conductive gate fill layer 210 into two conductive gate slabs 211, where each conductive gate slab is included in a different gate structure on a different region of the substrate.

In one or more embodiments, the exposed portion of the bottom source/drain layer 120 can be removed to extend the isolation region trench 190 through the bottom source/drain layer 120 at least to the surface of the substrate 110. The isolation region trench 230 can extend into the substrate 110 to electrically separate the bottom source/drain layer 120 into two regions, where each region can be a bottom source/drain 121 for a FinFET device. The exposed portion of the bottom spacer layer 180 and source/drain layer 120 can be removed using a selective, directional etch, for example, a selective RIE.

In one or more embodiments, a portion of the substrate 110 can be removed from the bottom of the isolation region trench 230 to extend the isolation region trench into the substrate 110. Extension of the isolation region trench 230 into the substrate 110 can further electrically isolate two FinFET devices subsequently formed on the source/drain layer.

In one or more embodiments, the isolation region trench 230 can have a width in the range of about 20 nm to about 100 nm, or in the range of about 30 nm to about 70 nm, although other widths are also contemplated.

In one or more embodiments, the isolation region trench 230 can extend into the substrate 110 by a distance in the range of about 20 nm to about 100 nm, or in the range of about 40 nm to about 80 nm, although other depths are also contemplated.

In one or more embodiments, an isolation region material 235 can be formed on the substrate 110 and, and exposed surfaces of the bottom source/drains 121, where the filler layer can be blanket deposited on the exposed surfaces.

In one or more embodiments, the isolation region material 235 can be silicon oxide (SiO), a low-K insulating dielectric, silicon oxynitride (SiON), carbon doped silicon oxide, fluorine doped silicon oxide, boron carbon nitride (BCN), hydrogen silsesquioxane polymer (HSQ), methyl silsesquioxane polymer (MSQ), methyl doped silica or $SiO_x(CH_3)_y$, or $SiC_xO_yH_z$, organosilicate glass (SiCOH), porous SiCOH, and/or combinations thereof. The isolation region material 235 can be a different material from the bottom spacer layer 180 and/or filler layer 220, so the isolation region material 235 can be selectively removed without removing the bottom spacer layer 180 or filler layer 220. In various embodiments, the isolation region material 235 can be the same material as the filler layer 220, so the materials can be removed at the same time with the same isotropic etch.

In various embodiments, the resist material and/or hardmask can be removed after formation of the isolation region trench 230 or the isolation region material 235, where the resist material and/or hardmask can be removed using techniques known in the art (e.g., stripping, ashing, etching, etc.). Removal of the resist material and/or hardmask can re-expose the gate structure(s) and vertical fin(s) 131 for subsequent processing.

In one or more embodiments, a portion of the filler layer 220 can be removed to reduce the height of the filler layer 220 to be approximately even with the top surface of the conductive gate slabs 211 to provide an even, flat surface prior to formation of a top spacer layer.

Figure 10:
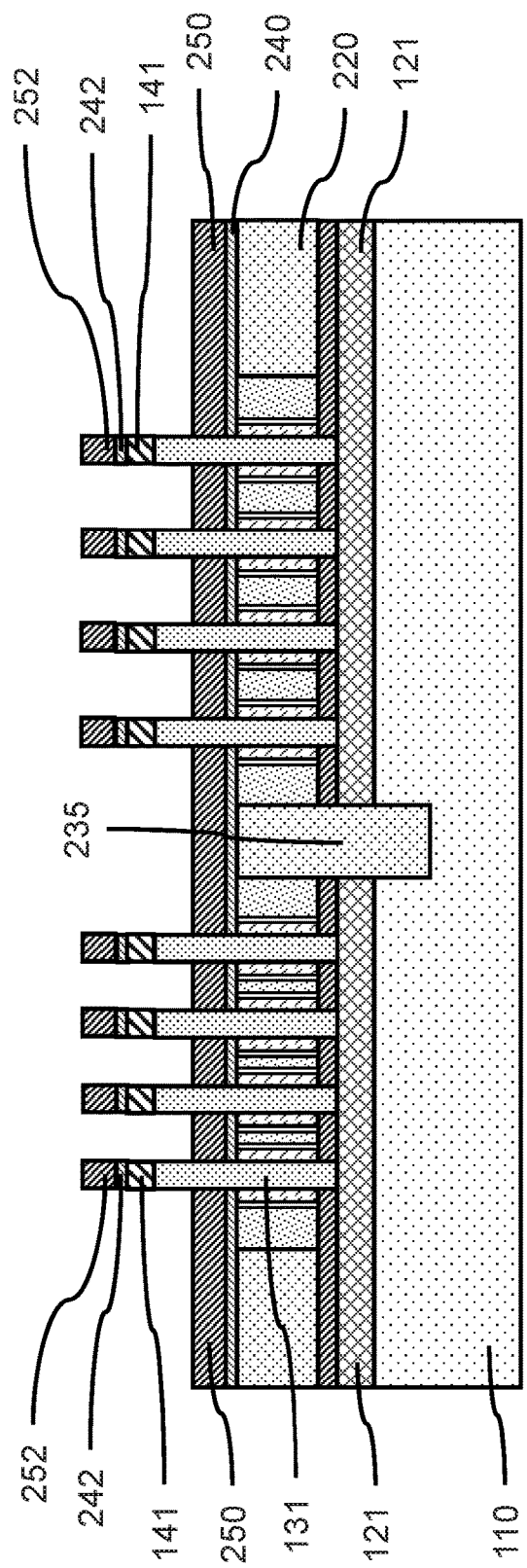
FIG. 10 is a cross-sectional side view showing a protective layer and a top spacer layer on the filler layer and gate structures, in accordance with an embodiment of the present invention.

FIG. 10 is a cross-sectional side view showing a protective layer and a top spacer layer on the filler layer and gate structures, in accordance with an embodiment of the present invention.

In one or more embodiments, the height of the excess filler layer material can be reduced to provide a smooth, flat surface. A protective layer 240 can be formed on the exposed surfaces of the filler layer 220, conductive gate slabs 211, work function layer 200, gate dielectric layer 190, and sidewalls of the vertical fins 131.

In one or more embodiments, the protective layer 240 can be silicon carbonitride (SiCN), silicon boronitride (SiBN), silicon borocarbide (SiBC), silicon boro carbonitride (SiBCN), boron carbide (BC), boron nitride (BN), or combinations thereof. The protective layer 240 can be formed on the exposed surfaces by a directional deposition technique, for example, GCIB deposition, to eliminate or minimize the deposition of the protective layer material on the sidewalls of the vertical fins 131. In various embodiments, the protective layer 240 can have a thickness in the range of about 0.5 nm to about 4 nm. The protective layer can protect a high-k material and gate electrode from potential damage induced by plasma doping.

In various embodiments, the directional deposition technique can form a protective liner 242 on the exposed top surface of the fin templates 141 made of the same material as the protective layer 240.

In one or more embodiments, a top spacer layer 250 can be formed on the protective layer 240, where the top spacer layer can be formed by a directional deposition technique, for example, GCIB deposition, to eliminate or minimize the deposition of the top spacer layer material on the sidewalls of the vertical fins 131. In various embodiments, the top spacer layer 250 can have a thickness in the range of about 2 nm to about 10 nm, where the thickness of the top spacer layer can determine a height of the vertical fin subsequently exposed to form top source/drains and/or an extension region.

In various embodiments, the directional deposition technique can form a top cap 252 on the exposed top surface of the protective liner 242 made of the same material as the top spacer layer 250.

In various embodiments, the top spacer layer 250 can be silicon nitride (SiN), silicon oxynitride (SiON), or a combination thereof, where the top spacer layer 250 can be a different material from the protective layer 240. The top spacer layer 250 can be selectively removed in relation to the protective layer 240.

Figure 11:
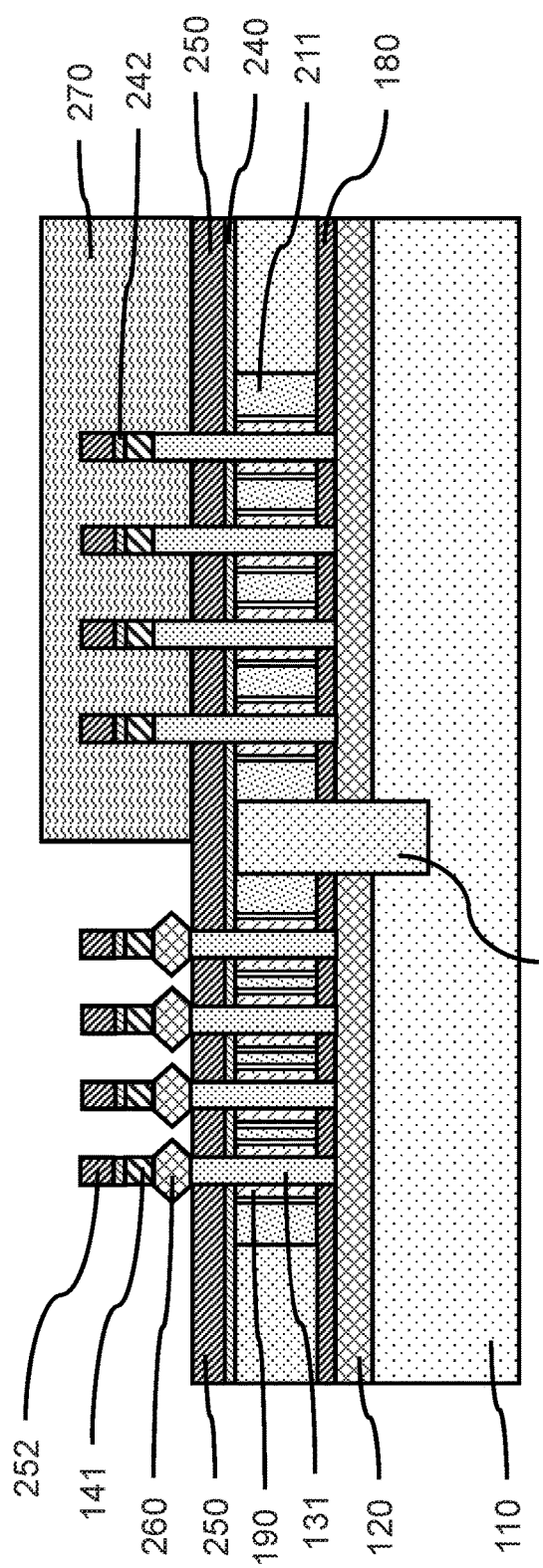
FIG. 11 is a cross-sectional side view showing a masking layer on the vertical fins on a second region of the substrate, and top source/drains formed on unmasked vertical fins on a first region of the substrate, in accordance with an embodiment of the present invention.

FIG. 11 is a cross-sectional side view showing a masking layer on the vertical fins on a second region of the substrate, and top source/drains formed on unmasked vertical fins on a first region of the substrate, in accordance with an embodiment of the present invention.

In one or more embodiments, a first masking layer 270 can be formed on the exposed vertical fin(s) 131, fin template(s) 141, protective liner(s) 242 and top cap(s) 252. The first masking layer 270 can be a photoresist material (e.g., poly methyl methacrylate (PMMA)) formed on the exposed surfaces, patterned and developed to expose the vertical fin(s) 131 on a first region of the substrate 110, while covering the vertical fins on a second region of the substrate 110.

In one or more embodiments, a top source/drain 260 can be formed on the surfaces of each vertical fin 131 exposed between the top surface of the top spacer layer 250 and the fin template 141 to form a first set of top source/drains 260. The top source/drains 260 can be formed by epitaxial growth on the exposed surfaces of the vertical fin(s) 131, where the size of the top source/drains may be limited to avoid formation of a merged source/drain. In various embodiments, the vertical fins on a first region of the substrate 110 can be separated by a predetermined distance and pitch, and the size of the top source/drains 260 of the first set controlled to be less than half the distance between two adjacent vertical fins 131.

In one or more embodiments, a gap between adjacent top source/drains 260 can have a width in the range of about 2 nm to about 20 nm, or in the range of about 5 nm to about 10 nm, where the size of the gap can be controlled to be bridged by a source/drain liner. The width of the top source/drains 260 can be in the range of about 10 nm to about 50 nm, or in the range of about 20 nm to about 30 nm.

In one or more embodiments, the top source/drain(s) 260 can be a single crystal semiconductor material formed on the vertical fin(s) 131 by epitaxial growth. Dopants can be implanted into the top source/drain(s), where the top source/drain(s) 260 can be in-situ doped (where doping and epitaxy growth are performed at the same time), and/or ex-situ doped (where doping occurs before and/or after epitaxy). Dopants can be incorporated during epitaxy or by other suitable doping techniques, including but not limited to, ion implantation, gas phase doping, plasma doping, plasma immersion ion implantation, cluster doping, infusion doping, liquid phase doping, solid phase doping, etc. In various embodiments, the top source/drain(s) 260 can be doped to form n-type or p-type source/drains to fabricate NFETs or PFETs.

Figure 12:
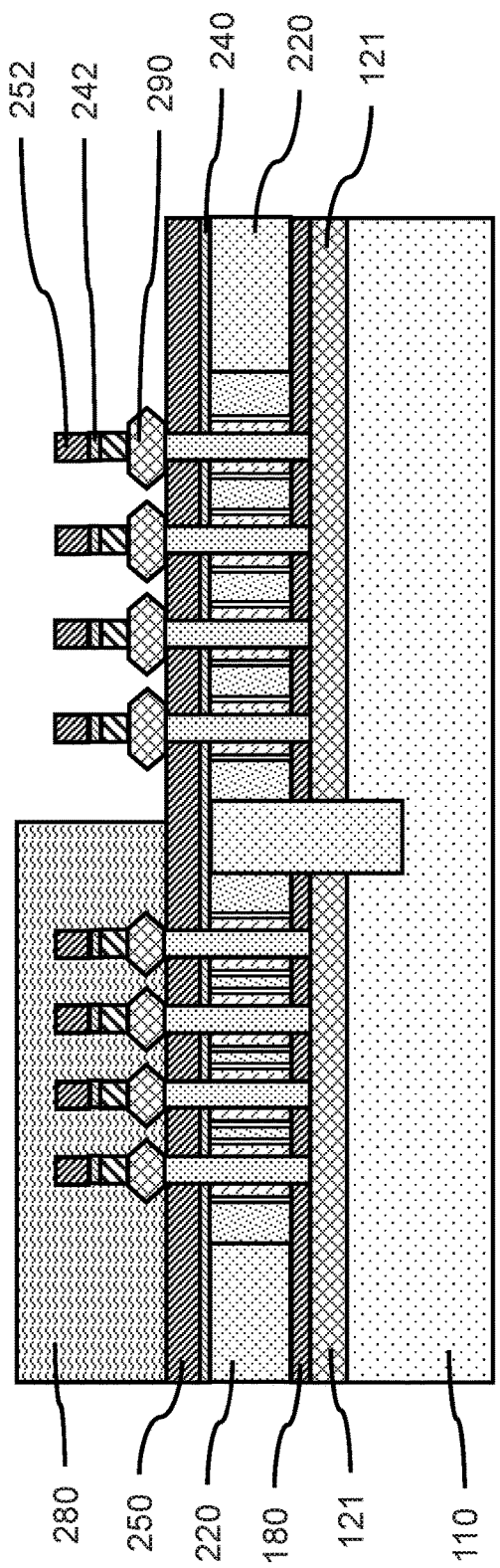
FIG. 12 is a cross-sectional side view showing a masking layer on the vertical fins and top source/drains on the first region of the substrate, and top source/drains formed on the unmasked vertical fins on the second region of the substrate, in accordance with an embodiment of the present invention.

FIG. 12 is a cross-sectional side view showing a masking layer on the vertical fins and top source/drains on the first region of the substrate, and top source/drains formed on the unmasked vertical fins on the second region of the substrate, in accordance with an embodiment of the present invention.

In one or more embodiments, the first masking layer 270 can be removed from the exposed vertical fin(s) 131, fin template(s) 141, protective liner(s) 242 and top cap(s) 252, and a second masking layer 280 can be formed on the top source/drains 260, fin template(s) 141, protective liner(s) 242 and top cap(s) 252 on the first region of the substrate 110. The second masking layer 280 can be a photoresist material (e.g., poly methyl methacrylate (PMMA)) that can be patterned and developed to expose the vertical fin(s) 131, fin template(s) 141, protective liner(s) 242 and top cap(s) 252 on the second region of the substrate.

In one or more embodiments, a top source/drain 290 can be formed on the surfaces of each vertical fin 131 exposed between the top surface of the top spacer layer 250 and the fin template 141 to form a second set of top source/drains 290. The top source/drains 290 can be formed by epitaxial growth on the exposed surfaces of the vertical fin(s) 131, where the size of the top source/drains may be limited to avoid formation of a merged source/drain. In various embodiments, the vertical fins 131 on the second region of the substrate 110 can be separated by a predetermined distance and pitch, which is larger than the distance and pitch separating the vertical fin(s) 131 on the first region of the substrate. The size of the top source/drains 290 of the second set can be controlled to be less than half the distance between two adjacent vertical fins 131, where the top source/drains 290 on vertical fin(s) 131 on the second region of the substrate can be larger than the top source/drain(s) 260 on the first region to compensate for the larger distance between two adjacent vertical fins 131.

In one or more embodiments, a gap between adjacent top source/drains 290 can be in the range of about 2 nm to about 20 nm, or in the range of about 5 nm to about 10 nm, where the size of the gap can be controlled to be bridged by a source/drain liner. The gap between adjacent top source/drains 290 can be the same as the gap between top source/drains 260. The width of the top source/drains 290 can be in the range of about 20 nm to about 70 nm, or in the range of about 10 nm to about 50 nm, or in the range of about 30 nm to about 40 nm.

In various embodiments, the vertical fins 131 in different regions can have different pitches/spacings, where the size of top source/drains can be adjusted to provide the same or similar gaps for formation of liner plugs. In various embodiments, the vertical fins 131 can have the same pitches/spacings.

In one or more embodiments, the epitaxially grown top source/drains 260,290 can have a diamond shape depending upon the crystal faces of the vertical fin 131 that the top source/drains are grown on. In various embodiments, the top source/drains 260, 290 can be grown until the top source/drains reach a predetermined size, where the top source/drains on the vertical fins 131 are separated by a predetermined distance.

Figure 13:
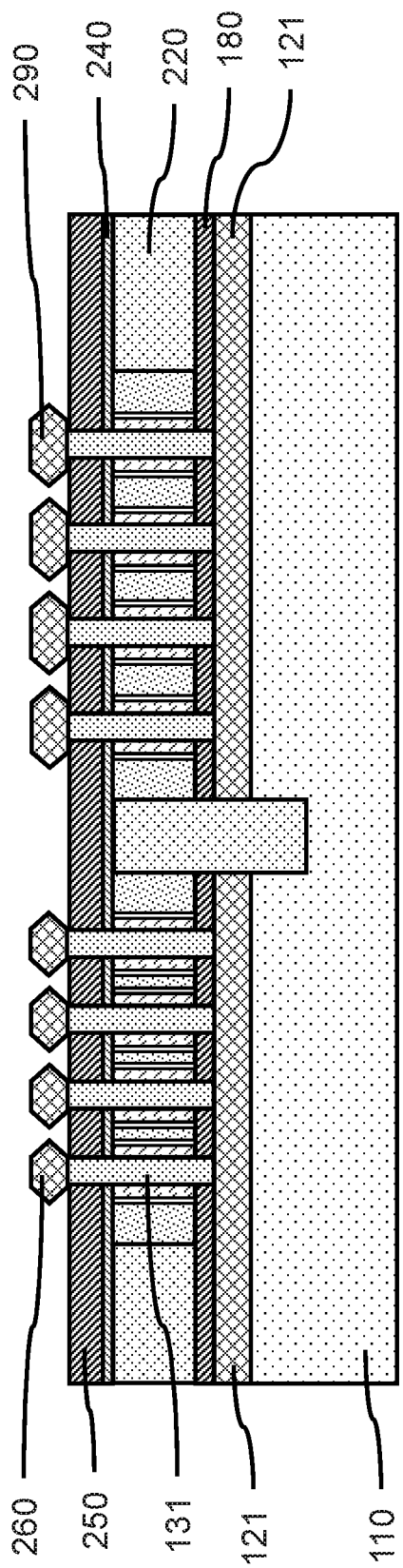
FIG. 13 is a cross-sectional side view showing exposed top source/drains and the top spacer layer after removal of the fin templates, protective liners and top caps, in accordance with an embodiment of the present invention.

FIG. 13 is a cross-sectional side view showing exposed top source/drains and the top spacer layer after removal of the fin templates, protective liners and top caps, in accordance with an embodiment of the present invention.

In one or more embodiments, the fin template(s) 141, protective liner(s) 242 and top cap(s) 252 can be removed to expose the top surface of the vertical fins 131. In embodiments, in which the fin template(s) 141, protective liner(s) 242 and top cap(s) 252 are different materials, multiple selective etching processes can be used to avoid damage to the vertical fins and top spacer layer 250.

Figure 14:
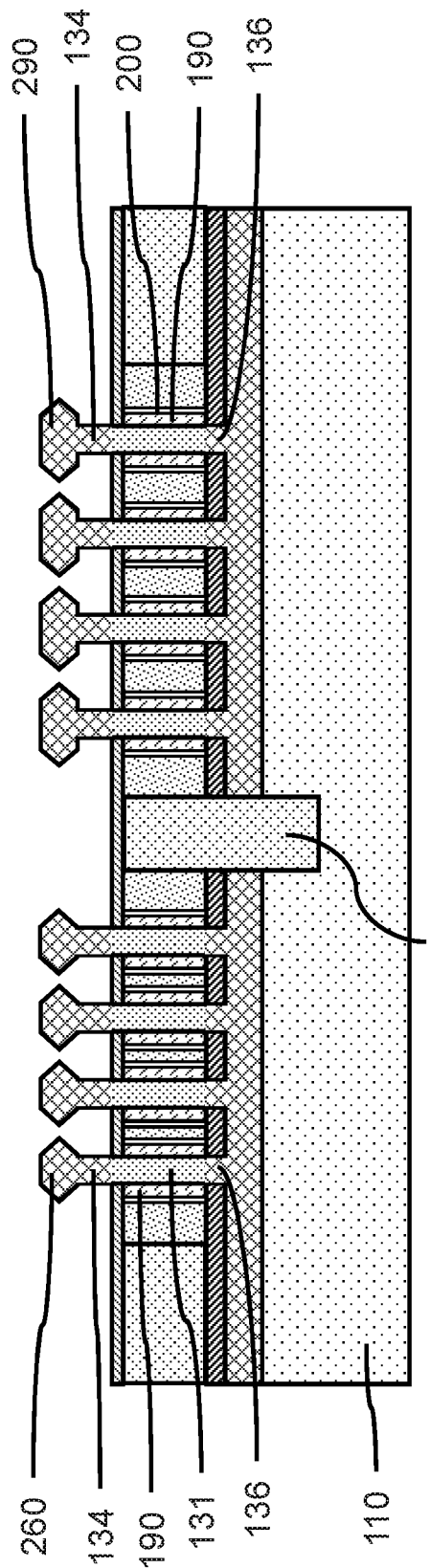
FIG. 14 is a cross-sectional side view showing exposed top source/drains, vertical fins, and protective liner after removal of the top spacer layer, in accordance with an embodiment of the present invention.

FIG. 14 is a cross-sectional side view showing exposed top source/drains, vertical fins, and protective liner after removal of the top spacer layer, in accordance with an embodiment of the present invention.

In one or more embodiments, the top spacer layer 250 can be removed by a selective isotropic etch that can remove top spacer layer material shadowed by the top source/drains 260, 290. The protective liner 240 can act as an etch stop for removal of the top spacer layer. Removal of the top spacer layer 250 can expose an upper section of the vertical fin 131 between the protective liner 240 and the top source/drains 260, 290.

In one or more embodiments, a plasma doping can be used to implant dopants into the portions of the vertical fin(s) 131 exposed by removal of the top spacer layer 250, where the protective liner 240 can prevent doping of the underlying materials. The portion of the vertical fin implanted with dopants can be a self-aligned top junction 134, also referred to as an extension region of the top source/drains 260, 290.

In one or more embodiments, a heat treatment can be used to provide for migration of dopants from the top source/drains 260, 290 and the bottom source/drains 121 into the portions of the vertical fin in contact with the top source/drains 260, 290 and the bottom source/drains 121. The duration and temperature of the heat treatment can be controlled to control the amount and extent of dopant diffusion into the vertical fins 131.

In one or more embodiments, controlled diffusion of dopants from the top source/drains 260, 290 and the bottom source/drains 121 into the portions of the vertical fin can form self-aligned top junction(s) 134 and self-aligned bottom junction(s) 136.

In various embodiments, the section of the vertical fin 131 between the self-aligned top junction 134 and self-aligned bottom junction 136 can form a channel of a FinFET, where the current would flow perpendicular to the plane of the substrate 110 from one source/drain to another passed the gate structure (e.g., a vertical FinFET). The gate structure can control the amount of current flowing through the channel of the FinFET device.

Figure 15:
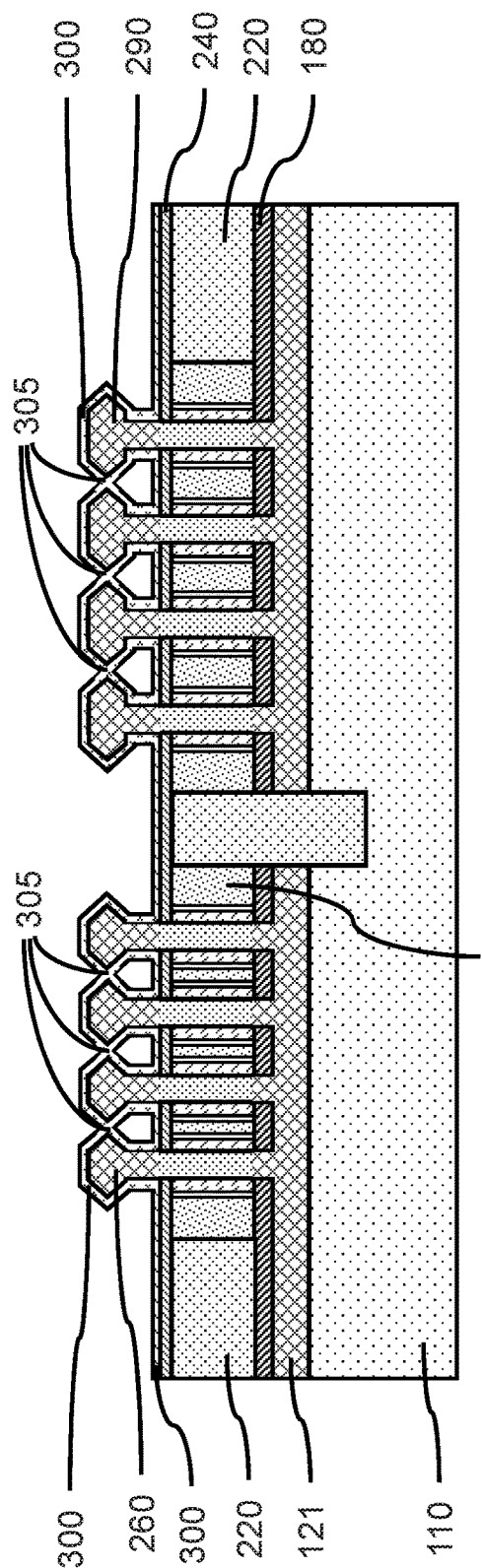
FIG. 15 is a cross-sectional side view showing a source/drain liner on the top source/drains and the protective liner, in accordance with an embodiment of the present invention.

FIG. 15 is a cross-sectional side view showing a source/drain liner on the top source/drains and the protective liner, in accordance with an embodiment of the present invention.

In one or more embodiments, a source/drain liner 300 can be formed on the top source/drains 260, 290, where the source/drain liner 300 can be formed by a conformal deposition, for example, ALD or PEALD. The conformal deposition can build up the thickness of the source/drain liner 300 monolayer by monolayer to control the final thickness of the source/drain liner 300. The source/drain liner 300 can be formed on adjacent top source/drains 260, 290 to have a thickness at which the source/drain liner 300 grows together to form a liner plug 305 in the gap. The conformal deposition can provide for formation of the source/drain liner 300 on the sides of the vertical fin(s) 131 facing each other across a void space and bottom surfaces of the top source/drains.

In one or more embodiments, the source/drain liner 300 has a thickness in the range of about 1 nm to about 10 nm, or in the range of about 2 nm to about 7 nm. In various embodiments, the source/drain liner 300 can be formed to a thickness suitable to occlude the gap between the adjacent top source/drains 260, 290, where, once the gap is occluded, the void space is sealed off.

In one or more embodiments, the source/drain liner can be can be silicon nitride (SiN), silicon oxynitride (SiON), silicon borocarbonitride (SiBCN), or a combination thereof.

Figure 16:
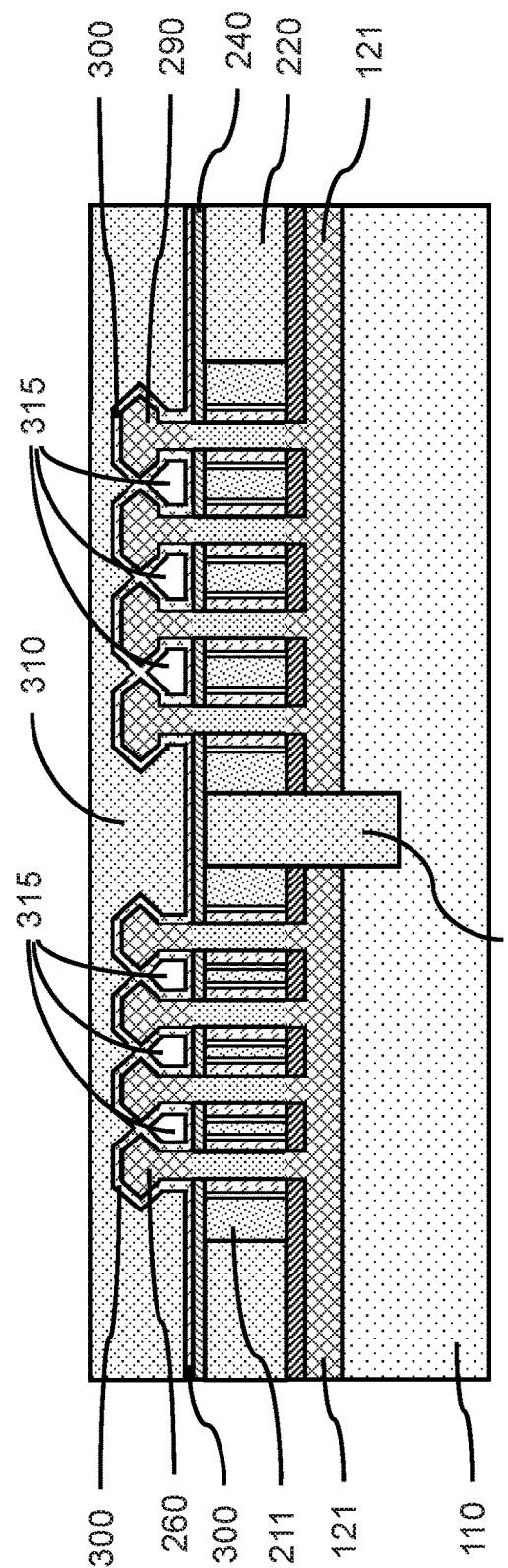
FIG. 16 is a cross-sectional side view showing an interlayer dielectric formed on the exposed surface of the source/drain liner, in accordance with an embodiment of the present invention.

FIG. 16 is a cross-sectional side view showing an interlayer dielectric formed on the exposed surface of the source/drain liner, in accordance with an embodiment of the present invention.

In one or more embodiments, an interlayer dielectric (ILD) 310 can be formed on the exposed surface of the source/drain liner 300, where the interlayer dielectric 310 can be blanket deposited (e.g., CVD, PECVD, PVD, spun on, etc.). The top surface of the ILD 310 can be above the top surfaces of the top source/drains 260, 290 and vertical fins 131.

In various embodiments, the ILD 310 can be silicon oxide (SiO), a low-K insulating dielectric, silicon oxynitride (SiON), carbon doped silicon oxide, fluorine doped silicon oxide, boron carbon nitride (BCN), hydrogen silsesquioxane polymer (HSQ), methyl silsesquioxane polymer (MSQ), methyl doped silica or $SiO_x(CH_3)_y$ or $SiC_xO_yH_z$, organosilicate glass (SiCOH), porous SiCOH, and/or combinations thereof. Excess ILD material may be etched back or removed by chemical-mechanical polishing (CMP). A chemical-mechanical polishing can be used to removed excess ILD material and provide a smooth flat surface.

In various embodiments, the liner plugs 305 in the gaps between adjacent vertical fins 131 can occlude the gap and prevent the ILD 310 material from filling the void spaces 315.

Figure 17:
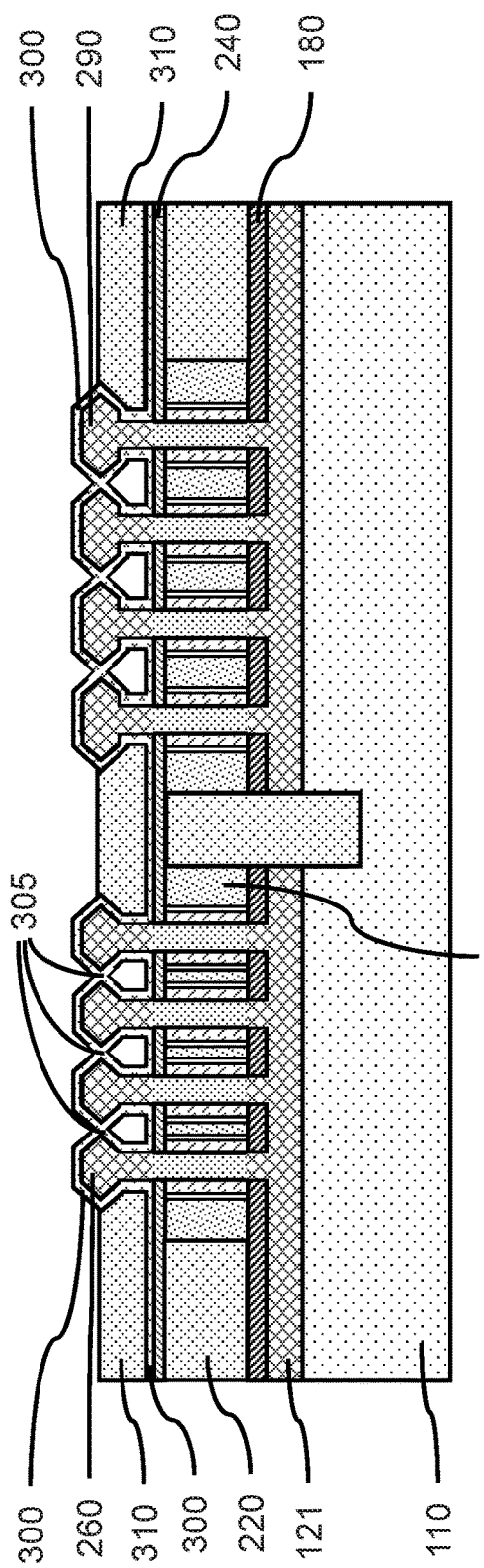
FIG. 17 is a cross-sectional side view showing the interlayer dielectric with a reduced height and partially exposed source/drain liner to access the upper surfaces of the top source/drains, in accordance with an embodiment of the present invention.

FIG. 17 is a cross-sectional side view showing the interlayer dielectric with a reduced height and partially exposed source/drain liner to access the upper surfaces of the top source/drains, in accordance with an embodiment of the present invention.

In one or more embodiments, the interlayer dielectric 310 can be partially removed to reduce the height and partially expose the underlying source/drain liner 300 on the upper surfaces of the top source/drains 260, 290. The interlayer dielectric 310 can be removed using an isotropic etch (e.g., wet etch) or anisotropic etch (e.g., RIE), where the amount of interlayer dielectric 310 removed can be controlled. A portion of the interlayer dielectric 310 can remain on the source/drain liner 310 on the lower surfaces of the top source/drains 260, 290 and the protective liner 240.

Figure 18:
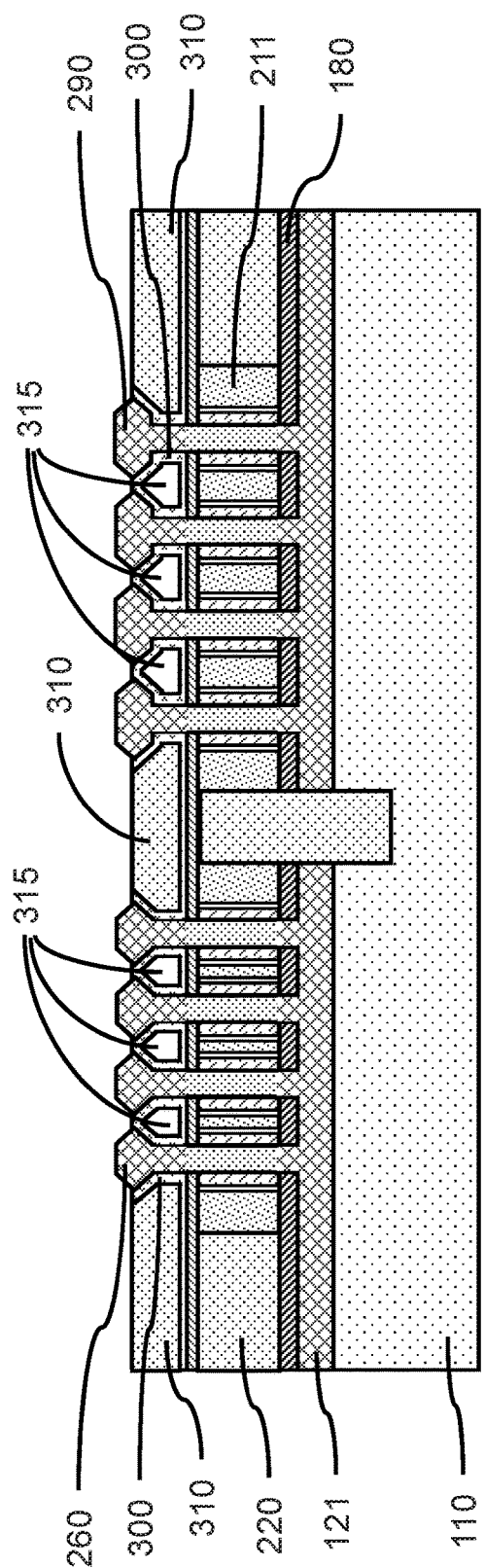
FIG. 18 is a cross-sectional side view showing the top surfaces of the top source/drains exposed after removal of a portion of the source/drain liner, in accordance with an embodiment of the present invention.

FIG. 18 is a cross-sectional side view showing the top surfaces of the top source/drains exposed after removal of a portion of the source/drain liner, in accordance with an embodiment of the present invention.

In one or more embodiments, the exposed portion of the source/drain liner 300 can be removed from the top source/drains 260, 290, for example, by a selective etch. In various embodiments, the source/drain liner 300 can be removed using a timed etch, which is stop before the liner plugs 305 would be removed from the gaps.

A portion of the source/drain liner can remain under the interlayer dielectric 310 and on the walls of the top source/drains within the void spaces 315.

Figure 19:
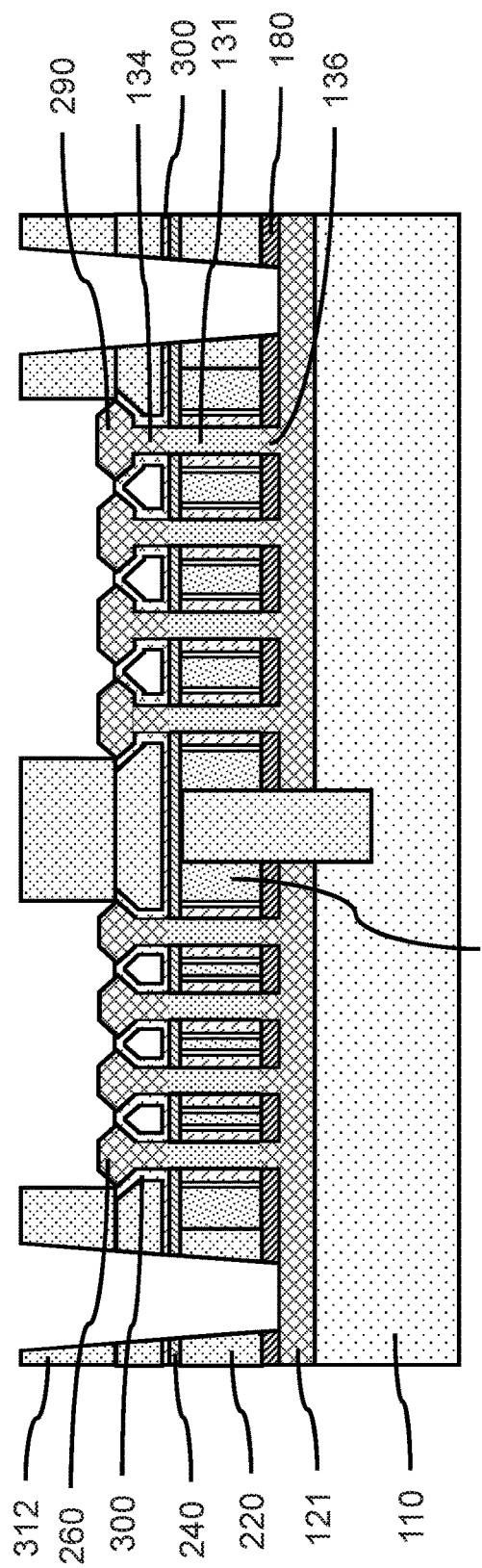
FIG. 19 is a cross-sectional side view showing a plurality of openings formed in a second ILD formed on the surfaces of the first ILD and the exposed top source/drains, in accordance with an embodiment of the present invention.

FIG. 19 is a cross-sectional side view showing a plurality of openings formed in a second ILD formed on the surfaces of the first ILD and the exposed top source/drains, in accordance with an embodiment of the present invention.

In one or more embodiments, a second interlayer dielectric (ILD) 312 can be blanket deposited on the exposed surfaces of the first ILD 310 and top source/drains 260, 290 previously exposed by removal of the source/drain liner 300. A CMP can be performed to provide a smooth, flat surface to the second ILD 312.

In various embodiments, the second ILD 312 can be silicon oxide (SiO), a low-K insulating dielectric, silicon oxynitride (SiON), carbon doped silicon oxide, fluorine doped silicon oxide, boron carbon nitride (BCN), hydrogen silsesquioxane polymer (HSQ), methyl silsesquioxane polymer (MSQ), methyl doped silica or $SiO_x(CH_3)_y$, or $SiC_xO_yH_z$, organosilicate glass (SiCOH), porous SiCOH, and/or combinations thereof. Excess ILD material may be etched back and/or removed by chemical-mechanical polishing (CMP) to provide a smooth flat surface.

In one or more embodiments, the top surface of the second ILD 312 can be masked (e.g., using a photoresist), and the mask patterned and developed to expose underlying portions of the second ILD. The exposed portions can be above the top source rains 260 on the first region of the substrate 110, and the top source/drains 290 on the second region of the substrate. In addition, the exposed portions can be above sections of the bottom source/drains 121.

In one or more embodiments, the exposed portions of the second ILD 312 can be removed to form vias to the top source/drains 260, 290 and bottom source/drains 121, where the ILD can be removed by a directional etch. The vias can be formed through the filler layer 220 and bottom spacer layer 180 to the bottom source/drains 121, where each material can be removed by a separate selective etch.

The mask can be removed using techniques known in the art (e.g., etching, stripping, ashing, etc.).

Figure 20:
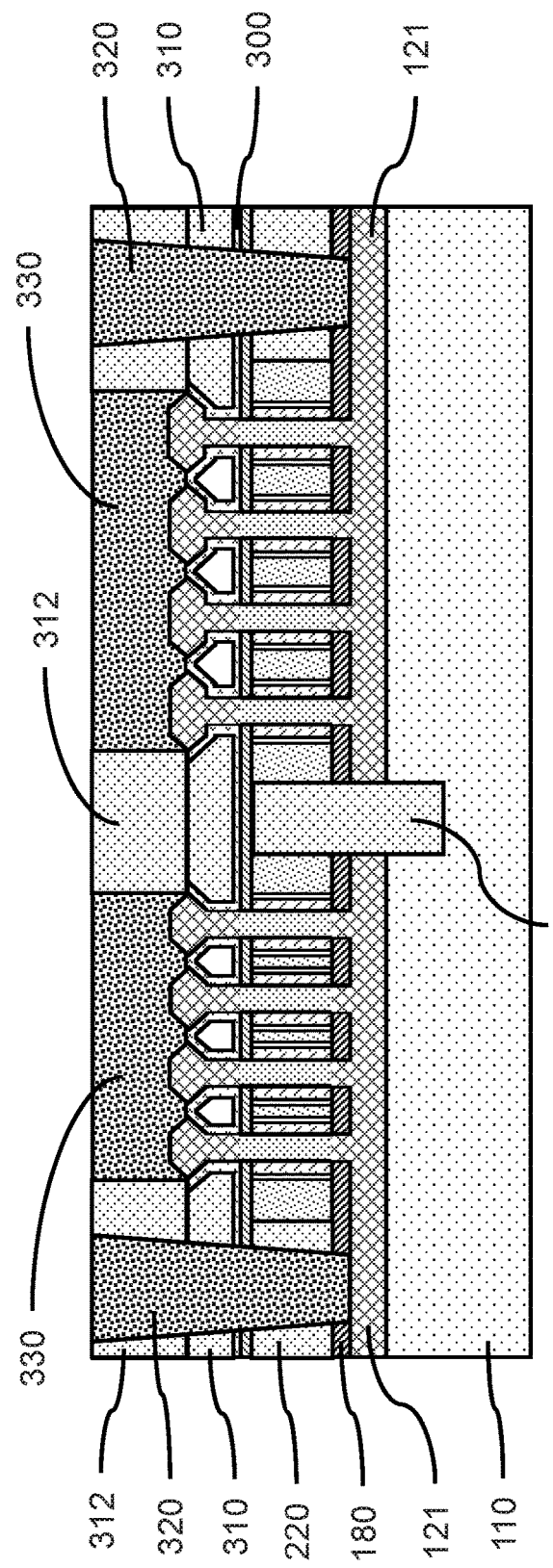
FIG. 20 is a cross-sectional side view showing source/drain contacts formed through the ILD, in accordance with an embodiment of the present invention.

FIG. 20 is a cross-sectional side view showing source/drain contacts formed through the ILD, in accordance with an embodiment of the present invention.

In one or more embodiments, the openings in the first and/or second ILD 300, 312 can be filled with a conductive material to form top source/drain contacts 330 and bottom source/drain contacts 320.

The source/drain contacts 320, 330 can be a conductive material, including but not limited to tungsten, titanium, tantalum, ruthenium, zirconium, cobalt, tantalum nitride, titanium nitride, cobalt silicide, nickel silicide, carbon nanotube, conductive carbon, graphene, or any suitable combination of these materials. The conductive material can further include dopants that are incorporated during or after deposition.

In various embodiments, additional openings and electrical contacts can be formed to the gate electrode, where the electrical contacts are also made of a conductive material.

In one or more embodiments, a pair of vertical fin devices (e.g., FinFETs) can be formed on adjacent regions of a substrate 110, where a first bottom source/drain 121 is separated from a second bottom source/drain 121 by an isolation region 230 filled with an isolation region material 235. In various embodiments, at least two vertical fins 131 can be formed on each of the bottom source/drains 121, where the vertical fins on the same bottom source/drain can be separated by a first distance. A vertical fin 131 on the first bottom source/drain can be separated from an adjacent vertical fin 131 on the neighboring second bottom source/drain by a second distance, where the first distance can be the same or different from the second distance. The vertical fins 131 on the first region of the substrate can form the first set, and the vertical fins 131 on the second region of the substrate can form a second set.

In one or more embodiments, a gate structure can be formed on each of the vertical fins 131, where a single gate structure may be on two adjacent vertical fins.

In one or more embodiments, a top source/drain 260 can be formed on each of the at least two vertical fins 131 on the first region of the substrate, and on the at least two vertical fins 131 on the second region of the substrate 110. The isolation region 230 can separate a first fin field effect transistor device from a second fin field effect transistor device.

The at least two vertical fins 131 on the first bottom source/drain 121 can form a first fin field effect transistor device, and the at least two vertical fins 131 on the second bottom source/drain 121 can form a second fin field effect transistor device, where the two fin field effect transistor devices can be electrically coupled, for example, to form a complementary metal-oxide-semiconductor (CMOS) device.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, it will also be understood that when a layer is referred to as being "between" t layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
   at least two vertical fins on a first region of a substrate;
   at least two vertical fins on a second region of the substrate adjacent to the first region, wherein the distance between an adjacent pair of the vertical fins on the second region is greater than the distance between an adjacent pair of the vertical fins on the first region of the substrate;
   a top source/drain on each of the at least two vertical fins on the first region, wherein the top source/drains are separated by a first gap;
   a top source/drain on each of the at least two vertical fins on the second region, wherein the top source/drains on the second region are larger than the top source/drains on the at least two vertical fins on the first region, and wherein the top source/drains are separated by a second gap; and
   a source/drain liner on the top source/drains on the first region and the second region, wherein the source/drain liner forms liner plugs that occlude the first and second gaps between the top source/drains to form a void space between the at least two vertical fins on the first region, and between the at least two vertical fins on the second region.

2. The semiconductor device of claim 1, wherein the first gap between adjacent top source/drains in the first region and the second gap between adjacent top source/drains in the second region are in the range of about 2 nm to about 20 nm.

3. The semiconductor device of claim 1, wherein the width of the top source/drain on each of the at least two vertical fins on the second region is in a range of about 20 nm to about 70 nm.

4. The semiconductor device of claim 1, wherein the width of the top source/drain on each of the at least two vertical fins on the first region is in a range of about 10 nm to about 50 nm.

5. The semiconductor device of claim 1, wherein the source/drain liner has a thickness in the range of about 1 nm to about 10 nm.

6. The semiconductor device of claim 1, wherein the source/drain liner is selected from the group consisting of silicon nitride (SiN), silicon oxynitride (SiON), silicon borocarbonitride (SiBCN), and combinations thereof.

7. The semiconductor device of claim 1, further comprising an isolation region filled with an isolation region material separating the at least two vertical fins on the first region from the at least two vertical fins on the second region.

8. The semiconductor device of claim 7, further comprising a first bottom source/drain between the at least two vertical fins on the first region and the substrate, and a second bottom source/drain between the at least two vertical fins on the second region and the substrate.

9. A plurality of vertical fin devices with top air spacers and a self-aligned top junction, comprising:
   a first bottom source/drain and a second bottom source/drain on a substrate;
   at least two vertical fins on the first bottom source/drain;
   at least two vertical fins on the second bottom source/drain;
   a top source/drain on each of the at least two vertical fins on the first bottom source/drain, wherein the top source/drains are separated by a first gap;
   a top source/drain on each of the at least two vertical fins on the second bottom source/drain, wherein the top source/drains are separated by a second gap having about the same size as the first gap between the top source/drains on the at least two vertical fins on the first bottom source/drain; and
   a source/drain liner on the at least four top source/drains, wherein the source/drain liner forms liner plugs that occlude the first and second gaps between the top source/drains to form a void space between the at least two vertical fins on the first bottom source/drain, and between the at least two vertical fins on the second bottom source/drain.

10. The vertical fin device of claim 9, wherein the first and second gaps have a width in the range of about 2 nm to about 20 nm.

11. The vertical fin device of claim 9, wherein the at least two vertical fins on the first bottom source/drain are separated by a distance in the range of about 15 nm to about 50 nm, and the at least two vertical fins on the second bottom source/drain are separated by a distance in the range of about 20 nm to about 80 nm.

12. The vertical fin device of claim 9, wherein the source/drain liner has a thickness in the range of about 1 nm to about 10 nm.

13. The vertical fin device of claim 12, wherein the source/drain liner is selected from the group consisting of silicon nitride (SiN), silicon oxynitride (SiON), silicon borocarbonitride (SiBCN), and combinations thereof.

14. The vertical fin device of claim 12, wherein a first top source/drain contact is in electrical contact with the top source/drains on the at least two vertical fins on the first bottom source/drain, and a second top source/drain contact is in electrical contact with the top source/drains on the at least two vertical fins on the second bottom source/drain.

15. A plurality of vertical fin devices with top air spacers and a self-aligned top junction, comprising:
   a first bottom source/drain and a second bottom source/drain on a substrate, wherein the first bottom source/drain is separated from the second bottom source/drain by an isolation region in the substrate filled with an isolation region material;
   at least two vertical fins on the first bottom source/drain;
   at least two vertical fins on the second bottom source/drain;
   a gate structure on each of the at least four vertical fins;
   a top source/drain on the at least two vertical fins on the first bottom source/drain, wherein the top source/drains are separated by a first gap;
   a top source/drain on the at least two vertical fins on the second bottom source/drain, wherein the top source/drains are separated by a second gap having about the same size as the first gap between the top source/drains on the at least two vertical fins on the first bottom source/drain; and
   a source/drain liner on the at least four top source/drains, wherein the source/drain liner forms liner plugs that occlude the first and second gaps between the top source/drains to form a void space between the at least two vertical fins on the first bottom source/drain, and between the at least two vertical fins on the second bottom source/drain.

16. The plurality of vertical fin devices of claim 15, wherein the first and second gaps have a width in the range of about 2 nm to about 20 nm.

17. The plurality of vertical fin devices of claim 15, wherein the at least two vertical fins on the first bottom source/drain are separated by a distance in the range of about 15 nm to about 50 nm, and the at least two vertical fins on the second bottom source/drain are separated by a distance in the range of about 20 nm to about 80 nm.

18. The plurality of vertical fin devices of claim 15, wherein the source/drain liner is silicon nitride (SiN), silicon oxynitride (SiON), or a combination thereof.

19. The plurality of vertical fin devices of claim 18, wherein the source/drain liner has a thickness in the range of about 1 nm to about 10 nm.

20. The plurality of vertical fin devices of claim 19, further comprising self-aligned top junctions and self-aligned bottom junctions.

* * * * *